US011425365B2

(12) United States Patent
Ishii et al.

(10) Patent No.: US 11,425,365 B2
(45) Date of Patent: Aug. 23, 2022

(54) PHOTOELECTRIC CONVERSION DEVICE, METHOD OF MANUFACTURING PHOTOELECTRIC CONVERSION DEVICE, AND METHOD OF MANUFACTURING SEMICONDUCTOR DEVICE

(71) Applicant: CANON KABUSHIKI KAISHA, Tokyo (JP)

(72) Inventors: Ryunosuke Ishii, Tokyo (JP); Akira Oseto, Kawasaki (JP); Tatsunori Kato, Kawasaki (JP); Takanori Watanabe, Yamato (JP); Nobuaki Kakinuma, Tokyo (JP); Hiroaki Kobayashi, Kawasaki (JP); Katsuhito Sakurai, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 272 days.

(21) Appl. No.: 16/703,144

(22) Filed: Dec. 4, 2019

(65) Prior Publication Data
US 2020/0195916 A1 Jun. 18, 2020

(30) Foreign Application Priority Data

Dec. 14, 2018 (JP) .............................. JP2018-234636
Sep. 4, 2019 (JP) .............................. JP2019-161284

(51) Int. Cl.
*H04N 17/02* (2006.01)
*H04N 17/00* (2006.01)
(Continued)

(52) U.S. Cl.
CPC ........... *H04N 17/002* (2013.01); *H01L 22/14* (2013.01); *H01L 22/34* (2013.01);
(Continued)

(58) Field of Classification Search
CPC ...... H04N 17/002; H04N 5/372; H04N 5/379; H01L 22/14; H01L 22/34; H01L 27/14634; H01L 27/14636; H01L 27/1469
See application file for complete search history.

(56) References Cited

U.S. PATENT DOCUMENTS 6,188,094 B1 2/2001 Kochi et al.
6,670,990 B1 12/2003 Kochi et al.
(Continued)

FOREIGN PATENT DOCUMENTS

WO 2015/159766 A1 10/2015

OTHER PUBLICATIONS

U.S. Appl. No. 16/687,860, filed Nov. 19, 2019 (First Named Inventor: Tatsunori Kato).

*Primary Examiner* — Tony Ko
(74) *Attorney, Agent, or Firm* — Venable LLP

(57) ABSTRACT

A photoelectric conversion device comprising: a first substrate that includes a pixel circuit including a photoelectric conversion element; a second substrate having a signal processing circuit that drives the pixel circuit or processes a signal from the pixel circuit; a connection part electrically connecting the first substrate and the second substrate; and an inspection circuit, wherein the inspection circuit is formed in one of the first and second substrates and is connected to a wire supplying a first potential and being provided in the one of the first and second substrates, and the inspection circuit is connected via the connection part to a wire supplying a second potential and being provided in the other of the first and second substrates.

22 Claims, 14 Drawing Sheets

(51) Int. Cl.
  *H01L 21/66* (2006.01)
  *H01L 27/146* (2006.01)
  *H04N 5/372* (2011.01)
  *H04N 5/369* (2011.01)

(52) U.S. Cl.
  CPC .... *H01L 27/1469* (2013.01); *H01L 27/14634* (2013.01); *H01L 27/14636* (2013.01); *H04N 5/372* (2013.01); *H04N 5/379* (2018.08)

(56) References Cited

U.S. PATENT DOCUMENTS

| | | | |
|---|---|---|---|
| 6,731,337 | B2 | 5/2004 | Watanabe |
| 6,960,751 | B2 | 11/2005 | Hiyama et al. |
| 7,110,030 | B1 | 9/2006 | Kochi et al. |
| 7,187,052 | B2 | 3/2007 | Okita et al. |
| 7,429,764 | B2 | 9/2008 | Koizumi et al. |
| 7,456,880 | B2 | 11/2008 | Okita et al. |
| 7,466,003 | B2 | 12/2008 | Ueno et al. |
| 7,514,732 | B2 | 4/2009 | Okita et al. |
| 7,538,810 | B2 | 5/2009 | Koizumi et al. |
| 7,679,658 | B2 | 3/2010 | Sakurai et al. |
| 7,872,286 | B2 | 1/2011 | Okita et al. |
| 7,911,521 | B2 | 3/2011 | Kuroda et al. |
| 7,920,192 | B2 | 4/2011 | Watanabe et al. |
| 7,935,995 | B2 | 5/2011 | Watanabe et al. |
| 7,982,789 | B2 | 7/2011 | Watanabe et al. |
| 8,110,885 | B2 | 2/2012 | Iida et al. |
| 8,115,847 | B2 | 2/2012 | Watanabe |
| 8,466,532 | B2 | 6/2013 | Watanabe |
| 8,570,418 | B2 | 10/2013 | Watanabe |
| 8,730,345 | B2 | 5/2014 | Watanabe |
| 8,779,544 | B2 | 7/2014 | Yamashita et al. |
| 9,123,621 | B2 | 9/2015 | Watanabe |
| 9,596,426 | B2 | 3/2017 | Handa et al. |
| 10,032,822 | B2 | 7/2018 | Takahashi |
| 10,297,633 | B2 | 5/2019 | Suzuki et al. |
| 10,382,707 | B2 | 8/2019 | Totsuka et al. |
| 2010/0214464 | A1 | 8/2010 | Watanabe |
| 2013/0181118 | A1 | 7/2013 | Koizumi et al. |
| 2014/0110811 | A1* | 4/2014 | Tsukimura ............. H01L 25/00 257/443 |
| 2016/0064429 | A1 | 3/2016 | Iida et al. |
| 2020/0068147 | A1 | 2/2020 | Hayashi et al. |

* cited by examiner

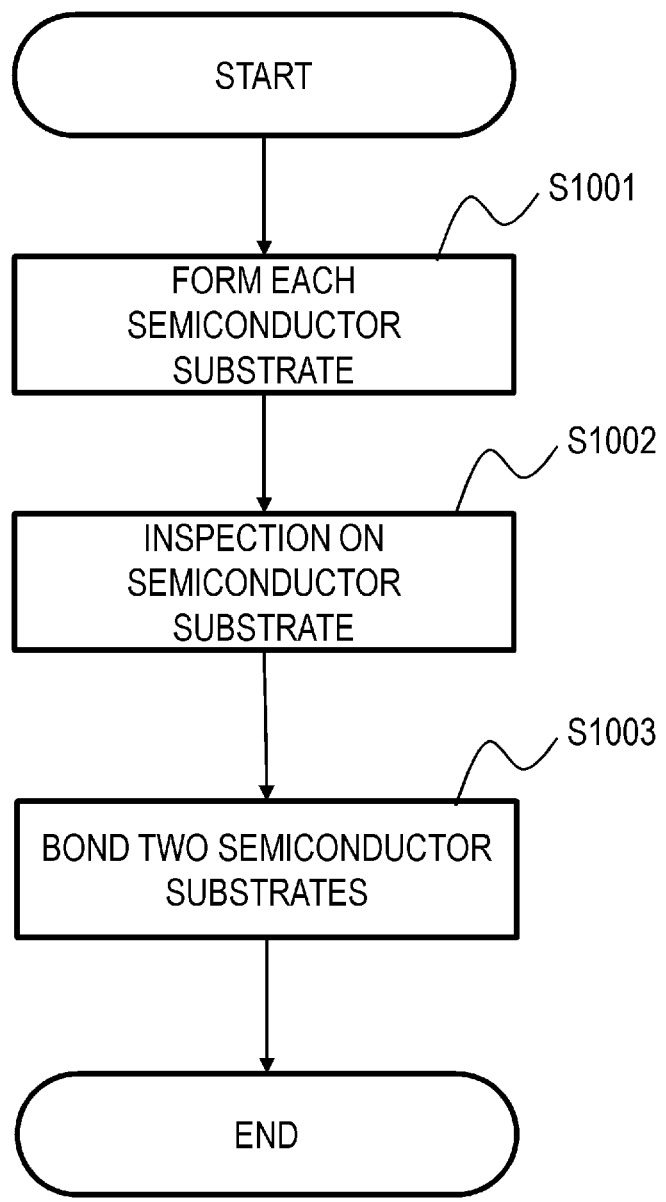

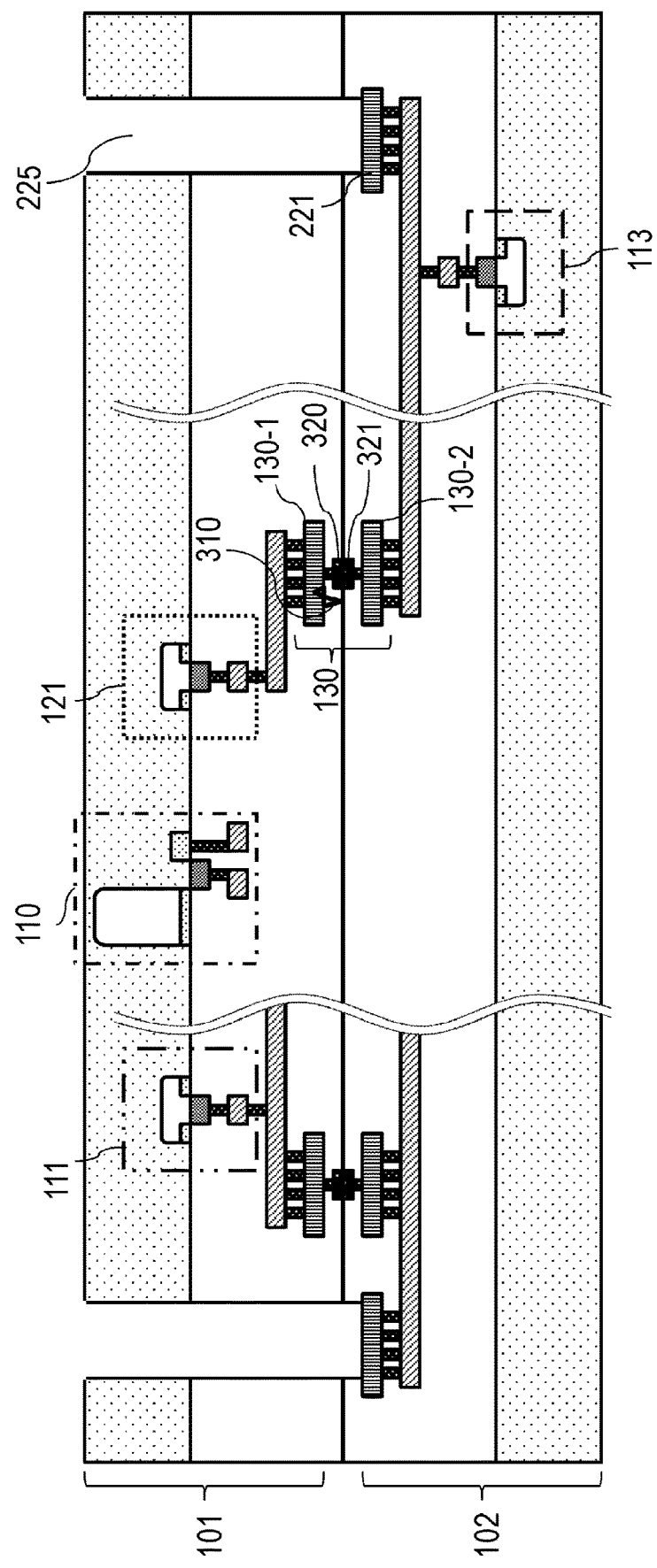

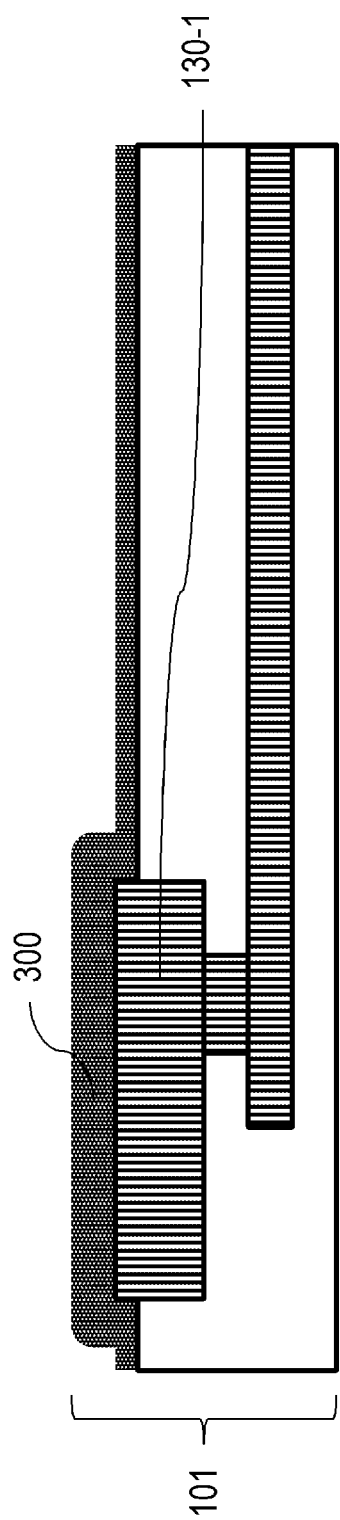
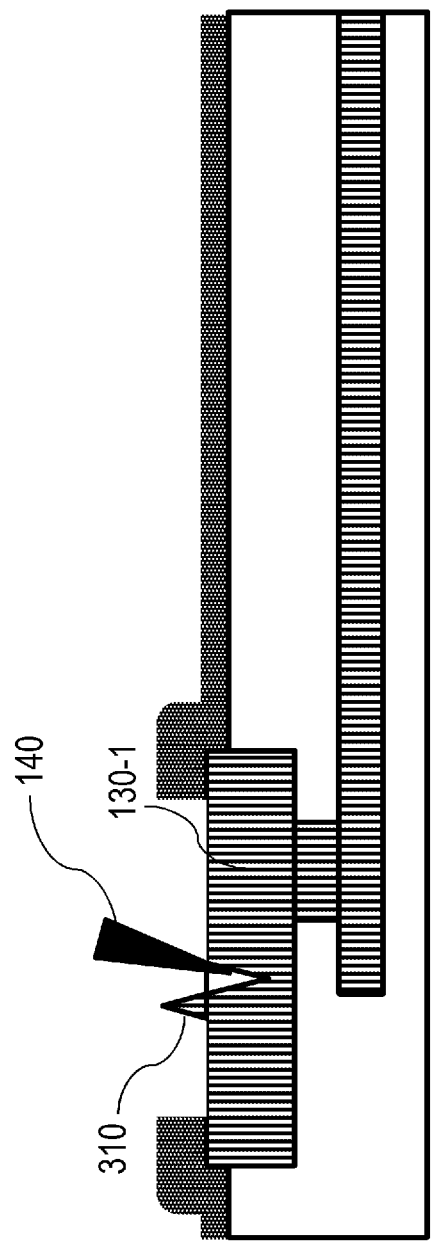

PHOTOELECTRIC CONVERSION DEVICE, METHOD OF MANUFACTURING PHOTOELECTRIC CONVERSION DEVICE, AND METHOD OF MANUFACTURING SEMICONDUCTOR DEVICE

BACKGROUND OF THE INVENTION

Field of the Invention

The present technique relates to a photoelectric conversion device, a method of manufacturing the photoelectric conversion device, and a method of manufacturing a semiconductor device.

Description of the Related Art

For CCD or amplifying solid-stage imaging devices used for digital still cameras and camcorders, stacked structures are proposed such that semiconductor chips having different functions are joined to be electrically connected. A solid-state imaging device having such a stacked structure (hereinafter, will be referred to as a photoelectric conversion device) allows formation of an optimum process and an optimum circuit for each semiconductor chip, thereby providing greater functionality with ease. In another proposal, a measurement is performed by an inspection circuit in a photoelectric conversion device before semiconductor chips are joined and then a wafer is selected or rejected or redundant repair is processed according to the measurement.

SUMMARY OF THE INVENTION

The inventors found that if an inspection circuit has an unstable input or output potential, the operation of the inspection circuit may change to an unstable state and cause voltage fluctuations. The inventors also found that the influence due to such a phenomenon superimposes a noise signal on an operation of a photoelectric conversion device (sensor) via capacitive coupling.

In WO 2015/159766, the input/output terminal (electrode; pad) of an inspection circuit is connected to an external connection pad via a stacked connection part while a power supply for feeding a potential (power supply potential) to the inspection circuit is connected to the external connection pad. This stabilizes the input or output potential of the inspection circuit.

In WO 2015/159766, however, the external connection pad for stabilizing the input or output potential of the inspection circuit, thereby reducing the degree of integration of a semiconductor chip. Furthermore, WO 2015/159766 does not describe a method (steps) of stabilizing the potential of an inspection circuit unconnected to the external connection pad. In other words, a photoelectric conversion device having the inspection circuit cannot obtain compatibility between a higher degree of integration and lower noise.

An object of the present invention is to provide a photoelectric conversion device having an inspection circuit with a high degree of integration and low noise.

A first aspect of the technology of the present disclosure is:

a photoelectric conversion device comprising:
a first substrate that includes a pixel circuit including a photoelectric conversion element;

a second substrate having a signal processing circuit that drives the pixel circuit or processes a signal from the pixel circuit;
a connection part electrically connecting the first substrate and the second substrate; and
an inspection circuit, wherein
the inspection circuit is formed in one of the first and second substrates and is connected to a wire supplying a first potential and being provided in the one of the first and second substrates, and
the inspection circuit is connected via the connection part to a wire supplying a second potential and being provided in the other of the first and second substrates.

A second aspect of the technology of the present disclosure is:

a method of manufacturing a photoelectric conversion device, comprising:
a step of preparing a first substrate having a pixel circuit including a photoelectric conversion element;
a step of preparing a second substrate having a signal processing circuit that drives the pixel circuit or processes a signal from the pixel circuit; and
a step of bonding the first substrate and the second substrate for forming a connection part electrically connecting the first substrate and the second substrate,
wherein one of the first and second substrates includes an inspection circuit having a power-supply connecting terminal connected to a wire supplying a first potential and being provided in the one of the first and second substrates, and
the step of bonding comprises:
a step of forming the connection part by using one of an input terminal and an output terminal of the inspection circuit which are different node from the power-supply connecting terminal of the inspection circuit; and
a step of connecting the one of the input terminal and the output terminal of the inspection circuit to a wire supplying a second potential and being provided in the other of the first and second substrates.

A third aspect of the technology of the present disclosure is:

a method of manufacturing a semiconductor device including a second substrate to be bonded to a first substrate, comprising:
a step of forming the second substrate including (1) a second circuit for driving a first circuit disposed in the first substrate or processing a signal from the first circuit and (2) an inspection circuit for inspecting the second circuit; and
a step of inspecting the second circuit with a probe brought into contact with at least one of the input terminal and the output terminal of the inspection circuit,
wherein, in the step of forming, the at least one of the input terminal and the output terminal of the inspection circuit is configured to be connected to a wire supplying a predetermined potential and being provided in the first substrate.

A fourth aspect of the technology of the present disclosure is:

a method of manufacturing a photoelectric conversion device, comprising:
a step of preparing a first substrate having a pixel circuit including a photoelectric conversion element;
a step of preparing a second substrate having a signal processing circuit that drives the pixel circuit or processes a signal from the pixel circuit;
a step of inspecting with a probe brought into contact with a terminal of an inspection circuit formed in one of the first and second substrates; and a step of bonding the first substrate and the second substrate to each other via a bonding portion so as to electrically connect the terminal of the inspection circuit to a wire supplying a predetermined potential and being provided in the other of the first and second substrates, the step of bonding comprising:
a step of forming, after the probe is brought into contact with the terminal in the step of the inspecting, an oxide film on the one of the first and second substrates,
a step of flattening the oxide film; and
a step of forming the bonding portion on the terminal of the inspection circuit having been in contact with the probe in the step of the inspecting.

A fifth aspect of the technology of the present disclosure is:

a method of manufacturing a photoelectric conversion device, comprising:

a step of preparing a first substrate having a pixel circuit including a photoelectric conversion element;

a step of preparing a second substrate having a signal processing circuit that drives the pixel circuit or processes a signal from the pixel circuit;

a step of inspecting with a probe brought into contact with a first terminal among a plurality of terminals of an inspection circuit formed in one of the first and second substrates, the plurality of terminals of an inspection circuit being connected to each other; and a step of bonding the first substrate and the second substrate to each other via a bonding portion so as to electrically connect the terminal of the inspection circuit formed to a wire for supplying a predetermined potential in the other of the first and second substrates, the step of bonding comprising:
a step of forming, after the probe is brought into contact with the first terminal in the step of inspecting, an oxide film on the one of the first and second substrates,
a step of flattening the oxide film; and
a step of forming the bonding portion on a second terminal among the plurality of terminals of the inspection circuit formed in the one of the first and second substrates, the second terminal being different from the first terminal.

The disclosure of the present technique can provide a photoelectric conversion device having an inspection circuit with a high degree of integration and low noise.

Further features of the present invention will become apparent from the following description of exemplary embodiments with reference to the attached drawings.

BRIEF DESCRIPTION OF THE DRAWINGS

FIG. 5 is a flowchart of a method of manufacturing the solid-state imaging device according to the embodiment;

FIG. 9 is a schematic cross-sectional view illustrating a solid-state imaging device according to Embodiment 4;

FIGS. 10A and 10B are cross-sectional views illustrating the process of manufacturing the solid-state imaging device according to Embodiment 4;

DESCRIPTION OF THE EMBODIMENTS

Embodiments of the present invention will be described below with reference to the accompanying drawings. The invention is not limited to the following embodiments.

Embodiment 1

In Embodiment 1 of the present invention, two semiconductor substrates are stacked in a photoelectric conversion device. A potential (power supply potential) is supplied to an inspection circuit formed on an inspection substrate that is one of the semiconductor substrates and the inspection circuit is connected to another potential on the other semiconductor substrate via a stacked connection part. With this configuration, even if the supplied potential changes, a potential (voltage) on the inspection circuit can be stabilized, thereby suppressing the occurrence of noise. In the present embodiment, an external connection pad is not used for connection to another potential and thus the degree of integration of the photoelectric conversion device improves.

Figure 1:
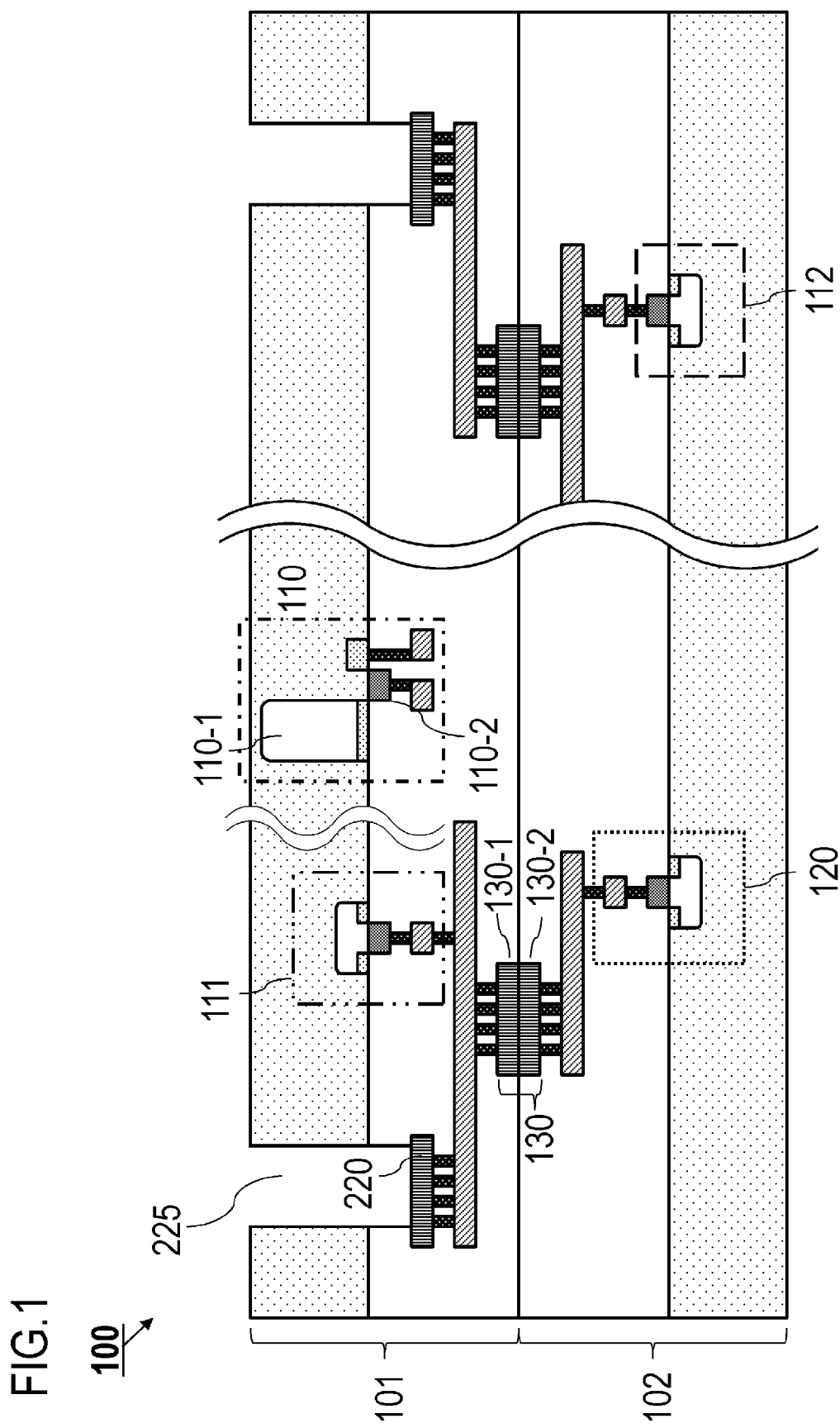
FIG. 1 is a schematic cross-sectional view illustrating a solid-state imaging device according to Embodiment 1.
Figure 2A:
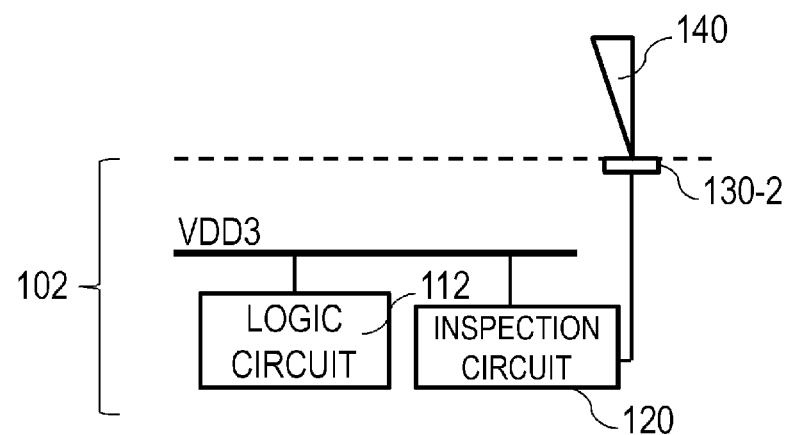
FIGS. 2A and 2B are schematic circuit diagrams illustrating the solid-state imaging device according to Embodiment 1.
Figure 2B:
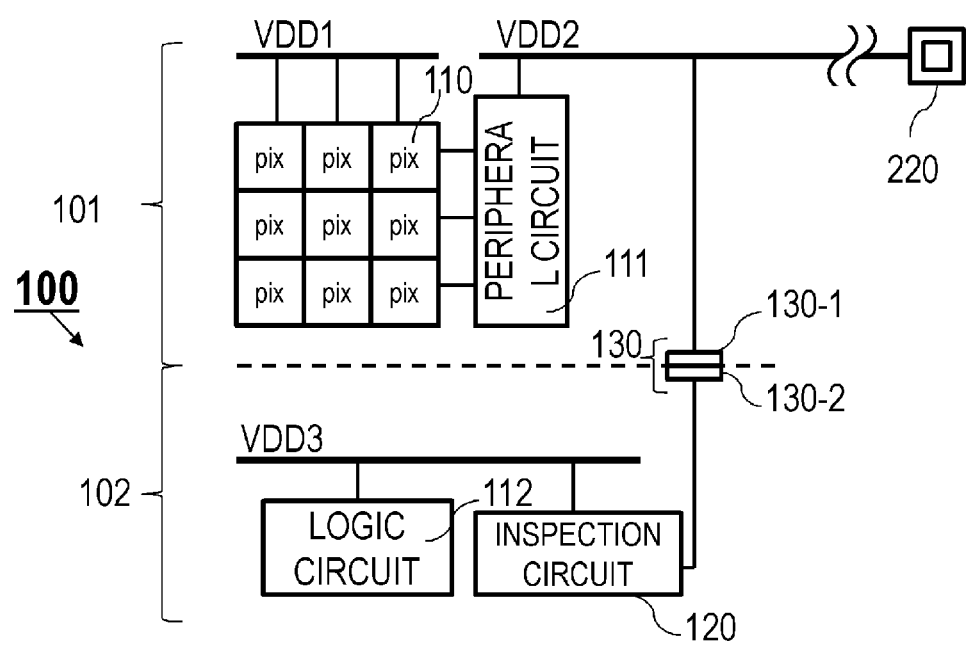

Referring to FIGS. 1, 2A, and 2B, a solid-state imaging device 100 acting as a photoelectric conversion device (stacked sensor; semiconductor device) according to the present embodiment will be described below.

Cross-Sectional Configuration of Solid-State Imaging Device

FIG. 1 is a cross-sectional view of the solid-state imaging device 100. The solid-state imaging device 100 has a stacked structure of two layers, that is, a semiconductor substrate 101 and a semiconductor substrate 102 which are stacked (bonded) to each other. In this configuration, the semiconductor substrate 101 and the semiconductor substrate 102 are electrically connected to each other via a stacked connection part 130. Thus, the stacked connection part 130 may be placed outside or included in both of the semiconductor substrate 101 and the semiconductor substrate 102.

The semiconductor substrate 101 has a sensor function. More specifically, the semiconductor substrate 101 includes a pixel circuit 110 and a peripheral circuit 111, the pixel circuit 110 having a photoelectric conversion element including a photodiode 110-1 and a select transistor 110-2.

Furthermore, the semiconductor substrate 101 has an external connection pad 220 that is an electrode for external connection. The external connection pad 220 can be wire-bonded through a through-silicon via (TSV) 225 formed on the semiconductor substrate 101.

The semiconductor substrate 102 includes a logic circuit (logic circuit; signal processing circuit) 112 for driving the pixel circuit 110 (photoelectric conversion element; sensor). The logic circuit 112 may include memory and a vertical signal line and process a signal outputted from the photoelectric conversion element. Signal processing may include processing for driving the pixel circuit 110. The configuration of the logic circuit 112 may be partially provided in the peripheral circuit 111. In order to perform the signal processing, the logic circuit 112 is electrically connected to the pixel circuit 110 via another stacked connection part having the same configuration as the stacked connection part 130.

In the present embodiment, the semiconductor substrate 102 has an inspection circuit 120 that is electrically connected to the same power supply (power supply wire) as the logic circuit 112. In this configuration, the inspection circuit 120 is connected to an input/output terminal 130-2 that is used for external input/output (connection) during an inspection on the semiconductor substrate 102. Thus, it may be understood that the inspection circuit 120 includes a power-supply connection part (not shown) electrically connected to the same power supply (power supply wire) as the logic circuit 112 and the input/output terminal 130-2. In the inspection circuit 120 of the present embodiment, the power-supply connection part (power-supply connecting terminal) and the input/output terminal 130-2 have different nodes (configurations). The input/output terminal 130-2 having an input terminal and an output terminal according to the present embodiment may have only one of the input and output terminals.

The inspection circuit 120 may conduct or stop a measurement after the two semiconductor substrates are joined to each other. For example, in a yield test on the logic circuit 112 including the vertical signal line and the memory in a pixel, the inspection circuit 120 does not conduct a measurement after the bonding. As described above, the inspection circuit 120 that does not conduct an inspection after bonding does not particularly need connection at a potential other than the same potential (power supply potential) as the logic circuit 112. This may increase the possibility of a potential change in an unstable state and the occurrence of noise. Thus, noise is more effectively suppressed in the present embodiment. If the inspection circuit 120 is formed on the semiconductor substrate 101, a yield on the pixel circuit 110 or the peripheral circuit 111 may be inspected.

Circuit Configuration of Solid-State Imaging Device

Referring to FIGS. 2A and 2B, the circuit configuration of the solid-state imaging device 100 will be described below.

FIG. 2A is a schematic circuit diagram illustrating the semiconductor substrate 102 before the two semiconductor substrates are joined to each other. As described above, the semiconductor substrate 102 includes the logic circuit 112 and the inspection circuit 120. In this configuration, a pad (not illustrated) provided on the semiconductor substrate 102 receives a potential and an activation pulse that are applied to activate the logic circuit 112 and the inspection circuit 120, so that the semiconductor substrate 102 can be activated. At this point, the inspection circuit 120 (the power-supply connection part of the inspection circuit 120) and the logic circuit 112 are connected to the same power supply (wire). A potential supplied from the power supply (power supply wire) to the inspection circuit 120 is a potential VDD3 shared with the logic circuit 112. After the operation of the semiconductor substrate 102 is started, a measurement probe 140 is brought into contact with at least one of the input terminal and the output terminal of the input/output terminal 130-2 for the inspection circuit 120, so that the semiconductor substrate 102 can be inspected. This allows determination of whether the semiconductor substrate 102 is a conforming item or not.

In the case of bonding for forming a stacked structure in each chip, the inspection is conducted so as to exclude defective chips, thereby preventing a failure after the formation of the stacked structure. This can reduce the cost of forming the solid-state imaging device 100. In the case of bonding for each semiconductor substrate, wafers having quite a large number of defective chips are excluded, thereby preventing a failure after the formation of the stacked structure.

Furthermore, locations where chip failures are likely to occur on the semiconductor substrate 101 may be determined from data on visual inspections on the foreign matters and defects of the semiconductor substrate 101 and in-line data including a thickness distribution. Moreover, a chip regarded as a defective chip on the semiconductor substrate 102 is joined to a chip that is likely to be defective on the semiconductor substrate 101, thereby reducing a fraction defective after the formation of the stacked structure.

FIG. 2B is a schematic circuit diagram illustrating electrical connection between the two semiconductor substrates in the solid-state imaging device 100 according to Embodiment 1. A potential VDD1 is the potential of the power supply of the pixel circuit 110 and a potential VDD2 is the potential of the power supply of the peripheral circuit 111. At least one of the input terminal and the output terminal of the input/output terminal 130-2 for the inspection circuit 120 is electrically connected to the input/output terminal 130-1 formed on the semiconductor substrate 101, constituting the stacked connection part 130. Moreover, the input of the inspection circuit 120 is electrically connected to the potential (fixed potential) of the semiconductor substrate 101 via the stacked connection part 130. More specifically, in the present embodiment, the input (input terminal) of the inspection circuit 120 is electrically connected to a predetermined power supply (power supply wire) for supplying the potential. The potential VDD2 of the power supply used in the peripheral circuit 111 can be used as the potential of the semiconductor substrate 101 connected to the input of the inspection circuit 120 (the potential is supplied to the input). At this point, if the stacked connection part 130 receives a potential that fixes the output of the inspection circuit 120, hot carrier injection (hot carrier luminescence) of the inspection circuit 120 can be suppressed. The inspection circuit 120 may be connected to, for example, the output potential of the peripheral circuit 111 as well as the potential VDD2 of the power supply of the peripheral circuit 111 via the stacked connection part 130. In addition to the input of the inspection circuit 120, the output (output terminal) of the inspection circuit 120 may be electrically connected to the potential of the semiconductor substrate 101 via the stacked connection part 130. In other words, it is only necessary to electrically connect at least one of the input terminal and the output terminal of the input/output terminal 130-2 for the inspection circuit 120 to the potential (fixed potential) of the semiconductor substrate 101.

Problems and Effects

Problems to be solved by the present embodiment will be described in detail. A potential (power supply potential) supplied to the inspection circuit 120 is shared with the logic circuit 112. Thus, in response to the supply of a potential for driving the logic circuit 112, the potential is also supplied to the inspection circuit 120. Thus, at the start of supply, the potential of the inspection circuit 120 is unstably changed such that the value of current passing through the inspection circuit 120 may not be controllable to a desired value. This may cause hot carrier luminescence and superimpose a false signal on the output signal of the solid-state imaging device 100.

To address the problem, in Embodiment 1, the input or output of the inspection circuit 120 formed in the semiconductor substrate 102 is connected to the potential of the semiconductor substrate 101 via the stacked connection part 130. With this configuration, the potential of the semiconductor substrate 101 is supplied to the inspection circuit 120 so as to stabilize the potential of the inspection circuit 120, so that noise caused by the inspection circuit 120 can be reduced without increasing the number of external connection pads.

Embodiment 2

In the solid-state imaging device according to Embodiment 1, the inspection circuit is formed on the same semiconductor substrate as the logic circuit, whereas in a solid-state imaging device (optical-electrical converter) according to the present embodiment has an inspection circuit on the same semiconductor substrate as a pixel circuit and a peripheral circuit. Referring to FIGS. 3, 4A, 4B, and 5, a solid-state imaging device 100 according to Embodiment 2 will be described below. The same configurations as those of Embodiment 1 are indicated by the same reference numerals and a detailed explanation thereof is omitted.

Cross-Sectional Configuration of Solid-State Imaging Device

Figure 3:
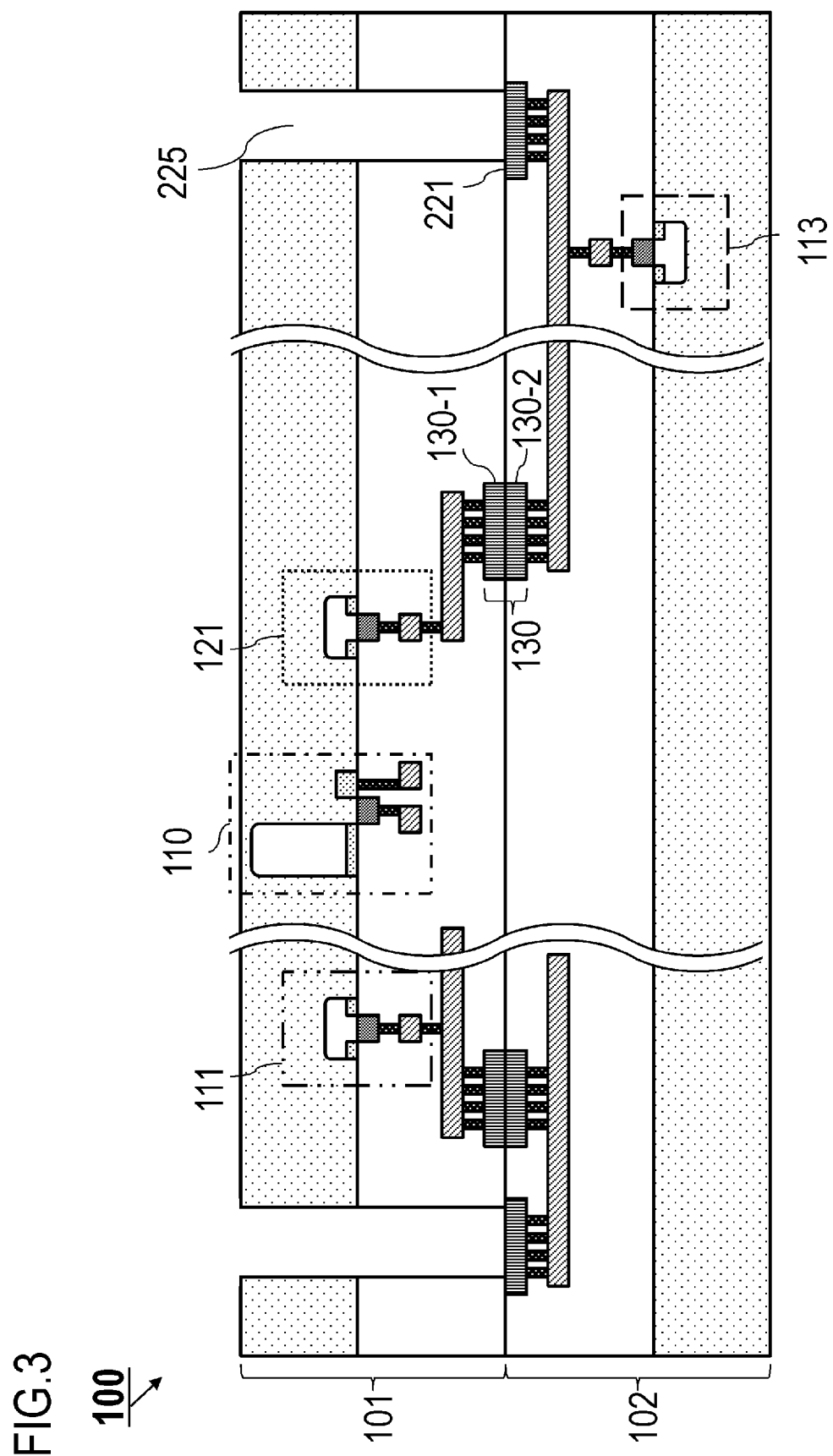
FIG. 3 is a schematic cross-sectional view illustrating a solid-state imaging device according to Embodiment 2.

FIG. 3 is a cross-sectional view of the solid-state imaging device 100. As in Embodiment 1, a semiconductor substrate 101 has a pixel circuit 110 and a peripheral circuit 111 and a semiconductor substrate 102 has a logic circuit 121 (not illustrated). In the present embodiment, the semiconductor substrate 102 has a logic circuit 113 in addition to the logic circuit 112. In the solid-state imaging device 100 according to the present embodiment, the semiconductor substrate 101 has an inspection circuit 121 unlike in Embodiment 1. Moreover, the semiconductor substrate 102 has an external connection pad 221. The external connection pad 221 can be wire-bonded through a TSV 225 formed on the semiconductor substrate 101.

Circuit Configuration of Solid-State Imaging Device

Figure 4A:
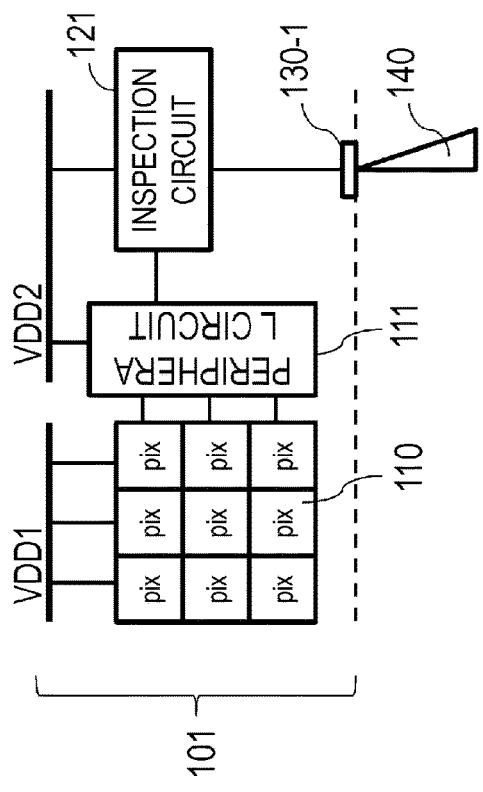
FIGS. 4A and 4B are schematic circuit diagrams illustrating the solid-state imaging device according to Embodiment 2.
Figure 4B:
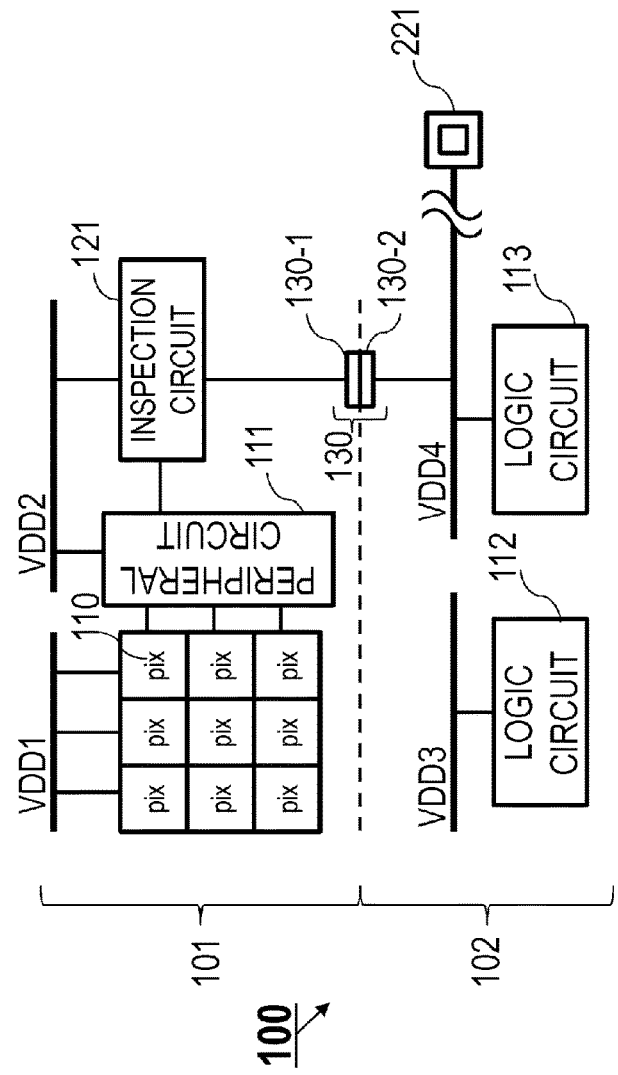

Referring to FIGS. 4A and 4B, the circuit configuration of the solid-state imaging device 100 according to the present embodiment will be described below.

FIG. 4A is a schematic circuit diagram illustrating the semiconductor substrate 101 before the two semiconductor substrates are joined to each other. The semiconductor substrate 101 includes the pixel circuit 110, the peripheral circuit 111, and the inspection circuit 121. In this configuration, a pad (not illustrated) provided on the semiconductor substrate 101 receives a potential and an activation pulse that are applied to activate the pixel circuit 110, the peripheral circuit 111, and the inspection circuit 121, so that the semiconductor substrate 101 can be activated. The power supply of the pixel circuit 110 has a potential VDD1 and a potential supplied to the inspection circuit 121 is shared with a potential VDD2 of the power supply of the peripheral circuit 111. In other words, the power-supply connection part of the inspection circuit 121 is electrically connected to the same power supply (power supply wire) as the peripheral circuit 111. After the operation of the semiconductor substrate 101 is started, a measurement probe 140 is brought into contact with one of the input terminal and the output terminal of an input/output terminal 130-1 for the inspection circuit 121, so that the semiconductor substrate 101 is inspected.

FIG. 4B is a schematic circuit diagram illustrating electrical connection between the two semiconductor substrates in the solid-state imaging device 100 according to Embodiment 2. At least one of the input terminal and the output terminal of the input/output terminal 130-1 for the inspection circuit 121 is electrically connected to the input/output terminal 130-2 formed on the semiconductor substrate 102, constituting the stacked connection part 130. In Embodiment 2, the input of the inspection circuit 121 is electrically connected to the potential (fixed potential) of the semiconductor substrate 102 via the stacked connection part 130. For example, a potential VDD4 used in the logic circuit 113 can be used as the potential of the semiconductor substrate 102. At this point, if the stacked connection part 130 receives a potential that fixes the output of the inspection circuit 121, alternating (AC) voltage fluctuations in the inspection circuit 121 can be suppressed. The inspection circuit 121 may be connected to other potentials, for example, the potential VDD3 of the power supply of the logic circuit 112 depending upon layout restrictions or the like.

Effects

In Embodiment 2, the input or output of the inspection circuit 121 on the same substrate as the pixel circuit 110 is connected to the potential of the other substrate via the stacked connection part 130. This can suppress, as in Embodiment 1, the occurrence of the hot carrier luminescence of the inspection circuit 121 and the superimposition of a false signal on the output signal of the solid-state imaging device 100 at the start of an operation (driving) of the solid-state imaging device 100. If the inspection circuit 121 is disposed on the same substrate as the pixel circuit 110, AC voltage fluctuations of the inspection circuit 121 may cause the superimposition of a false signal on the output signal of the solid-state imaging device 100 via capacitive coupling. This phenomenon can be suppressed by the present embodiment. In other words, noise caused by the inspection circuit 121 can be reduced by the present embodiment without increasing the number of external connection pads.

Method of Manufacturing Solid-State Imaging Device

Referring to a flowchart in FIG. 5, a method of manufacturing the solid-state imaging device 100 according to Embodiment 2 will be described below. At the beginning of the flowchart, two semiconductor substrates not including wires of semiconductor layers (silicon) are prepared.

S1001; Substrate Forming Step

At the beginning of the flowchart, elements, wires, and insulating layers are formed on the two semiconductor substrates so as to form the semiconductor substrate 101 and the semiconductor substrate 102. The elements include, for example, the pixel circuit 110, the peripheral circuit 111, and the inspection circuit 121. Moreover, the inspection circuit 121 is formed so as to be connected to the same power supply (potential; power supply wire) as the peripheral circuit 111. Gate electrodes constituting the circuits, device isolation, semiconductor regions, and wire layers can be manufactured by ordinary processes and thus a detailed explanation thereof is omitted. In this configuration, when the two semiconductor substrates are bonded in S1003, at least one of the input terminal and the output terminal of the input/output terminal 130-1 for the inspection circuit 121 can be connected to the power supply (power supply wire) for supplying the potential of the semiconductor substrate 102. In other words, the input/output terminal 131-1 of the semiconductor substrate 101 and the input/output terminal 131-2 of the semiconductor substrate 102 are formed at positions so as to physically come into contact with each other when the two semiconductor substrates are stacked. The semiconductor substrate 101 and the semiconductor substrate 102 may be prepared in advance. In other words, S1001 may be the step of preparing the semiconductor substrate 101 and the semiconductor substrate 102.

S1002; Inspecting Step

Subsequently, the semiconductor substrate 101 is measured (inspected) using the inspection circuit 121 through the input/output terminal 130-1 formed in the semiconductor substrate 101 as illustrated in FIG. 4A. For example, the semiconductor substrate 101 is operated by receiving a potential (power supply potential) and an activation pulse that are applied to drive the pixel circuit 110, the peripheral circuit 111, and the inspection circuit 121. Thereafter, the measurement probe 140 is brought into contact with at least one of the input terminal and the output terminal of the input/output terminal 130-1, so that the circuit characteristics (inspection results) of the pixel circuit 110 can be obtained through the inspection circuit 121. This can determine whether the semiconductor substrate 101 is a conforming item or not before the two semiconductor substrates are joined to each other. For example, only if it is determined in S1002 that the semiconductor substrate 101 is "non-defective", the process may advance to S1003.

After the measurement is conducted, a needle mark formed on the input/output terminal 130-1 by the measurement probe 140 during the measurement may be flattened as necessary. For example, the needle mark may be removed by wet etching, dry etching, or CMP.

S1003; Bonding Step

Thereafter, the semiconductor substrate 101 and the semiconductor substrate 102 are bonded to each other. At this point, the input/output terminal 130-1 of the inspection circuit 121 and the input/output terminal 130-2 formed on the semiconductor substrate 102 are electrically connected to each other, constituting the stacked connection part 130. Thus, a potential (power supply; power supply wire) on the semiconductor substrate 102 and the inspection circuit 121 are electrically connected to each other via the stacked connection part 130. The bonding in S1001 is not always necessary because the semiconductor substrate 101 for bonding has been formed and inspected. Specifically, S1001, S1002, and S1003 may be performed by different users. The present embodiment is also applicable to a manufacturing method for forming the semiconductor substrate 101 (semiconductor device) at the completion of the processing of S1002.

The input/output terminal 130-1 is preferable as long as the terminal is larger than a needle mark thereon. With this configuration, for example, even if the input/output terminal 130-1 is excessively ground in the step of removing a needle mark and causes difficulty in electrical connection made by joining, the effective area of the input/output terminal may be extended so as to ensure connection according to other methods.

In the foregoing example of the manufacturing method, AC voltage fluctuations of the inspection circuit 121 can be suppressed by connecting the input or output of the inspection circuit 121 to the potential of the semiconductor substrate 102 via the stacked connection part 130. Also in Embodiment 1, the stacked structure can be manufactured in the same process as the manufacturing method by forming the semiconductor substrate 102 including the inspection circuit 120.

Embodiment 3

In the solid-state imaging device according to Embodiment 2, one inspection circuit is formed for each one semiconductor substrate, whereas in a solid-state imaging device according to the present embodiment has two inspection circuits on a semiconductor substrate.

In this case, as in Embodiments 1 and 2, hot carrier luminescence may occur and a false signal may be superimposed on the output signal of the solid-state imaging device if the inputs or outputs of the two inspection circuits have unstable potentials during an operation (driving) of the solid-state imaging device. Additionally, if the two inspection circuits are disposed on the same substrate as a pixel circuit, AC voltage fluctuations of the two inspection circuits may cause the superimposition of a false signal on the output signal of the solid-state imaging device via capacitive coupling.

If the configurations of Embodiments 1 and 2 are applied in the provision of multiple inspection circuits, it is necessary to connect the input and output of the inspection circuit to different potentials via different stacked connection parts. In this case, a yield loss may occur due to layout restrictions or stacked connection.

Figure 6:
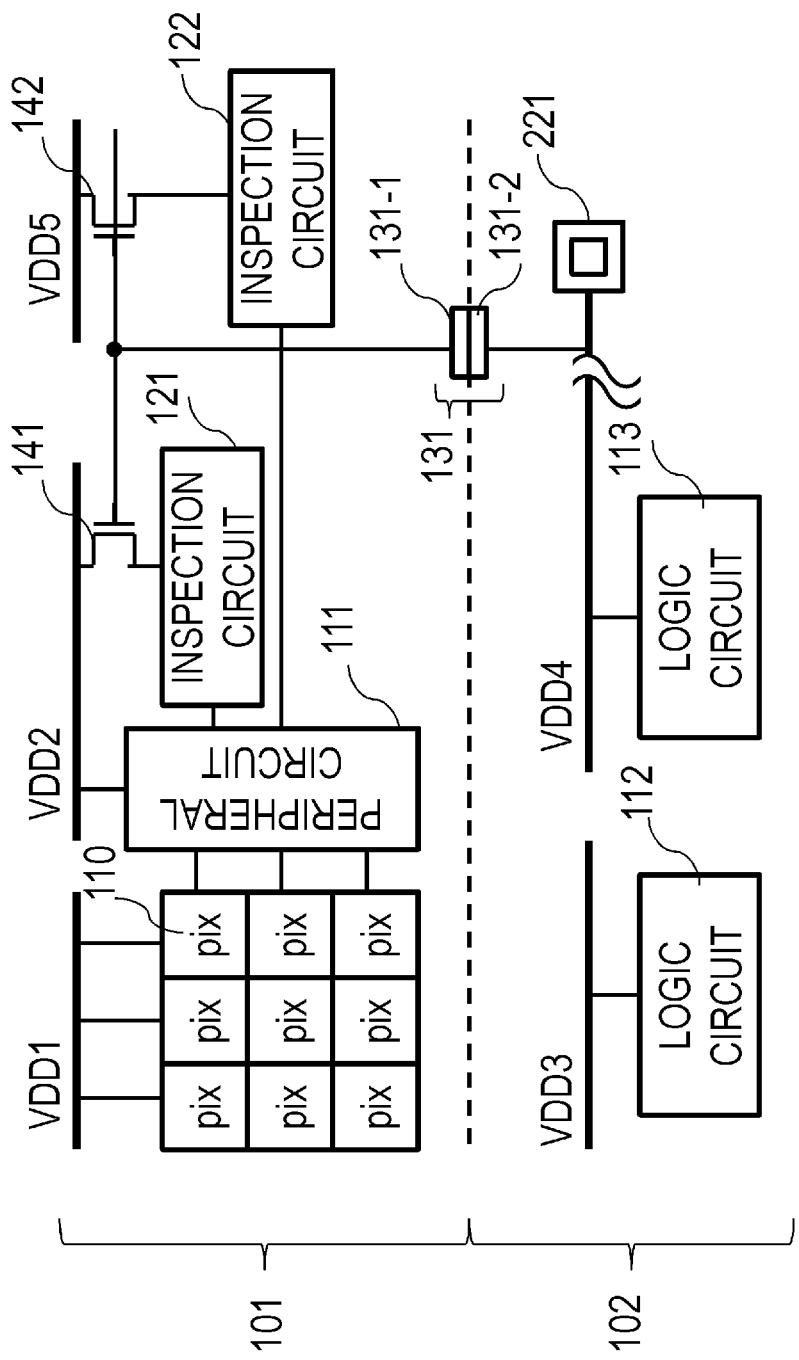
FIG. 6 is a schematic circuit diagram illustrating the solid-state imaging device according to Embodiment 3.

The present embodiment will describe a solid-state imaging device 100 in which the potentials of the input and output of two inspection circuits are stabilized by connecting the two inspection circuits to potentials via one stacked connection part by using two enable switches. Referring to a circuit diagram of electrical connection in FIG. 6, the solid-state imaging device 100 according to Embodiment 3 will be described below.

In the solid-state imaging device 100 according to the present embodiment, an inspection circuit 122 is formed on the semiconductor substrate 101 as a second inspection circuit in addition to the configuration of Embodiment 2. The power supply of a pixel circuit 110 has a potential VDD1 and the power supply of a peripheral circuit 111 has a potential VDD2. The power supply of a logic circuit 112 has a potential VDD3 and the power supply of a logic circuit 113 has a potential VDD4. In the present embodiment, the input/output terminal 131-1 is shared by an inspection circuit 121 and the inspection circuit 122.

In the present embodiment, the potential VDD2 is supplied to the inspection circuit 121 and a potential VDD5 is supplied to the inspection circuit 122. The inspection circuits 121 and 122 are electrically connected to enable switches 141 and 142, respectively. The gates of the enable switches 141 and 142 are shared and are electrically connected via a stacked connection part 131 to a potential where the switches are turned off. In other words, the gates of the enable switches 141 and 142 are connected to each other. In this configuration, the enable switches 141 and 142 switch between a state where the potential for turning off the switches passes through the inspection circuits and a state of electrical isolation (interruption). This can connect the inspection circuits 121 and 122 to a stable potential. For example, the potential VDD4 used in the logic circuit 113 can be used as the potential for turning off the switches.

When the enable switches 141 and 142 are turned off, the inspection circuits 121 and 122 may be grounded via a high-resistance pull-down resistor so as to prevent a floating node in the inspection circuits 121 and 122.

Effects

According to Embodiment 3, if multiple inspection circuits are formed, the number of electrical connections to a potential via the stacked connection part 131 can be reduced by using the enable switches having the shared gates. This can reduce a chip area and a yield loss caused by stacked connection. Moreover, AC voltage fluctuations of the inspection circuits can be suppressed as in Embodiments 1 and 2. Thus, noise caused by the inspection circuits can be reduced without increasing the number of external connection pads.

Embodiment 4

In the solid-state imaging device according to Embodiment 2, the input/output terminal 130-1 of the inspection circuit 121 of the semiconductor substrate 101 and the input/output terminal 130-2 formed on the semiconductor substrate 102 are directly connected to each other as illustrated in FIG. 3. In contrast, as illustrated in FIG. 9, the present embodiment describes a solid-state imaging device 100 in which a bonding portion 320 is formed on an input/output terminal 130-1 and semiconductor substrates are connected to each other via the bonding portion 320.

On the input/output terminal of an inspection circuit, a needle mark is formed by a measurement probe in contact with the terminal after an inspection is conducted. Thus, if the input/output terminal having a needle mark is used for joining the substrates, unevenness on the needle mark may deteriorate connection between the two semiconductor substrates and reduce the yield. For this reason, a reduction in yield may be suppressed by adding a removing step (flattening step) for removing a needle mark by wet etching or dry etching. In the present embodiment, the bonding portion 320 is formed (manufactured) so as to suppress a reduction in yield in the solid-state imaging device without adding the removing step.

Method of Manufacturing Solid-State Imaging Device

Referring to the flowchart in FIG. 5, a method of manufacturing the solid-state imaging device 100 according to Embodiment 4 will be described below. At the beginning of the flowchart, two semiconductor substrates not including wires of semiconductor layers (silicon) are prepared. The same configurations as those of Embodiment 2 are indicated by the same reference numerals and a detailed explanation thereof is omitted.

S1001; Substrate Forming Step

At the beginning of the flowchart, elements, wires, and insulating layers are formed on the two semiconductor substrates so as to form the semiconductor substrate 101 and the semiconductor substrate 102. The elements include, for example, a pixel circuit 110, a peripheral circuit 111, and an inspection circuit 121. Gate electrodes constituting the circuits, device isolation, semiconductor regions, and wire layers can be manufactured by ordinary processes and thus a detailed explanation thereof is omitted.

FIG. 10A is a cross-sectional view that features the wire layer of the semiconductor substrate 101 after the completion of S1001. On a surface of the semiconductor substrate 101, the input/output terminal 130-1 is formed by top metal and is covered with an oxide film 300.

S1002; Inspection Step

Subsequently, as illustrated in FIG. 10B, the oxide film 300 formed on the semiconductor substrate 101 is partially ground and opened on the input/output terminal 130-1. Thereafter, a measurement probe 140 (probe needle) is brought into contact with the input/output terminal 130-1 and the semiconductor substrate 101 is measured (inspected) by using the inspection circuit 121. At this point, a needle mark 310 is formed on the input/output terminal 130-1 by the measurement probe 140 (probe needle) in contact with the terminal.

S1003; Bonding Step

Figure 11A:
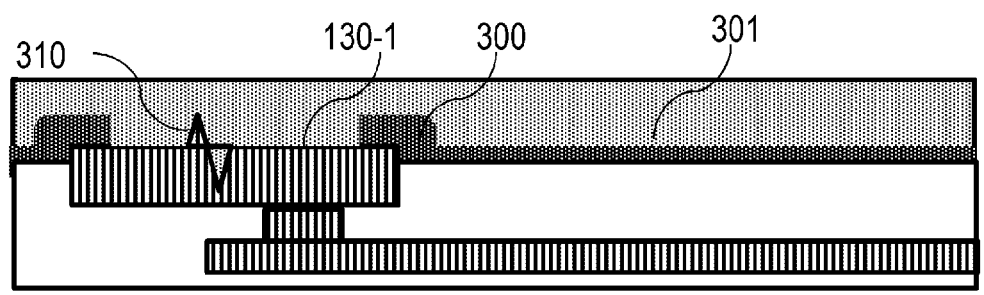
FIGS. 11A to 11C are cross-sectional views illustrating the process of manufacturing the solid-state imaging device according to Embodiment 4.

An oxide film is then formed and flattened. For example, an oxide film 301 is deposited by chemical vapor deposition (CVD) and then the surface of the oxide film 301 is flattened by chemical mechanical polishing (CMP). Thus, unevenness on the oxide film 300 can be eliminated as illustrated in FIG. 11A. The oxide film 301 is also placed into the needle mark 310 formed on the input/output terminal 130-1, thereby flattening the needle mark 310 as well.

Figure 11B:
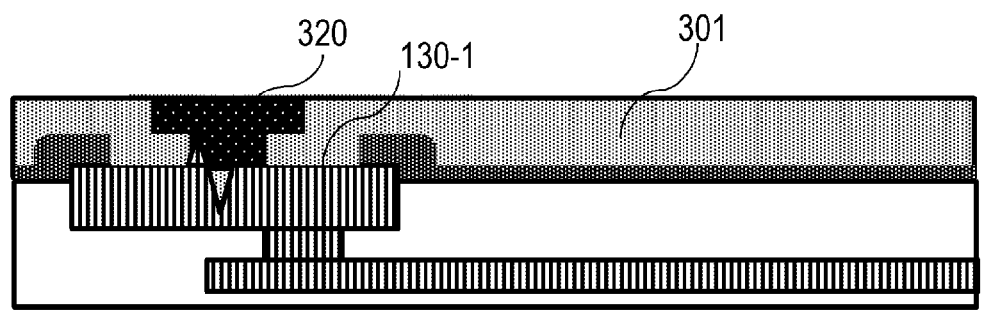

Thereafter, the bonding portion 320 is formed. As illustrated in FIG. 11B, the bonding portion 320 is formed on the input/output terminal 130-1. The bonding portion 320 having conductivity is, for example, a micro bump predominantly composed of copper. The bonding portion 320 is formed by, for example, an ordinary dual damascene method. At this point, multiple bonding portions 320 may be formed on the input/output terminal 130-1.

Figure 11C:
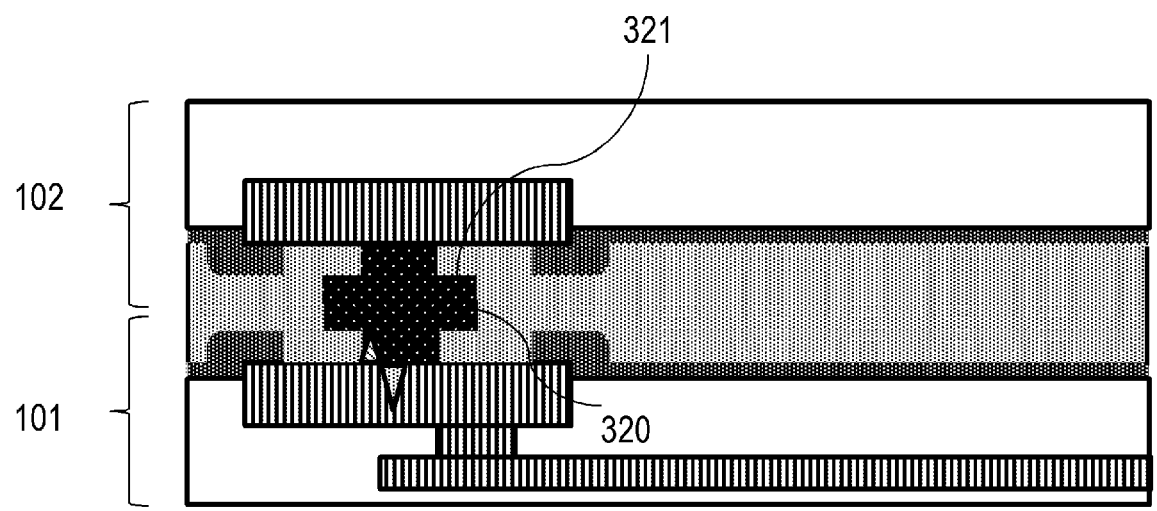

Thereafter, the semiconductor substrate 101 and the semiconductor substrate 102 are bonded to each other. For example, as illustrated in FIG. 11C, the bonding portion 320 is used to be bonded to a bonding portion 321 similarly formed on the other semiconductor substrate 102. Thus, after an inspection is conducted, the solid-state imaging device can be manufactured such that the semiconductor substrate 101 and the semiconductor substrate 102 are bonded to each other using the input/output terminal 130-1. With this configuration, as in Embodiment 2, the inspection circuit 121 is connected via the bonding portion 320 to a wire that supplies a potential in the semiconductor substrate 101.

In addition to bonding between the bonding portions 320, the bonding portion 320 of the semiconductor substrate 101 and the input/output terminal 130-2 of the semiconductor substrate 102 may be bonded to each other. The present embodiment described the solid-state imaging device including the inspection circuit 121 formed in the semiconductor substrate 101. The present embodiment is similarly applicable to a solid-state imaging device including an inspection circuit 120 formed in the semiconductor substrate 102.

Effects

In the method of manufacturing the solid-state imaging device, a reduction in yield can be suppressed without adding the step of removing a needle mark. In the present embodiment, the method of manufacturing the solid-state imaging device includes the steps of forming the oxide film, flattening the oxide film, and forming the bonding portions after the step of inspecting at least one of the semiconductor substrates. Thus, a reduction in yield due to a needle mark during an inspection can be suppressed without adding the removing step.

Embodiment 5

Figure 12:
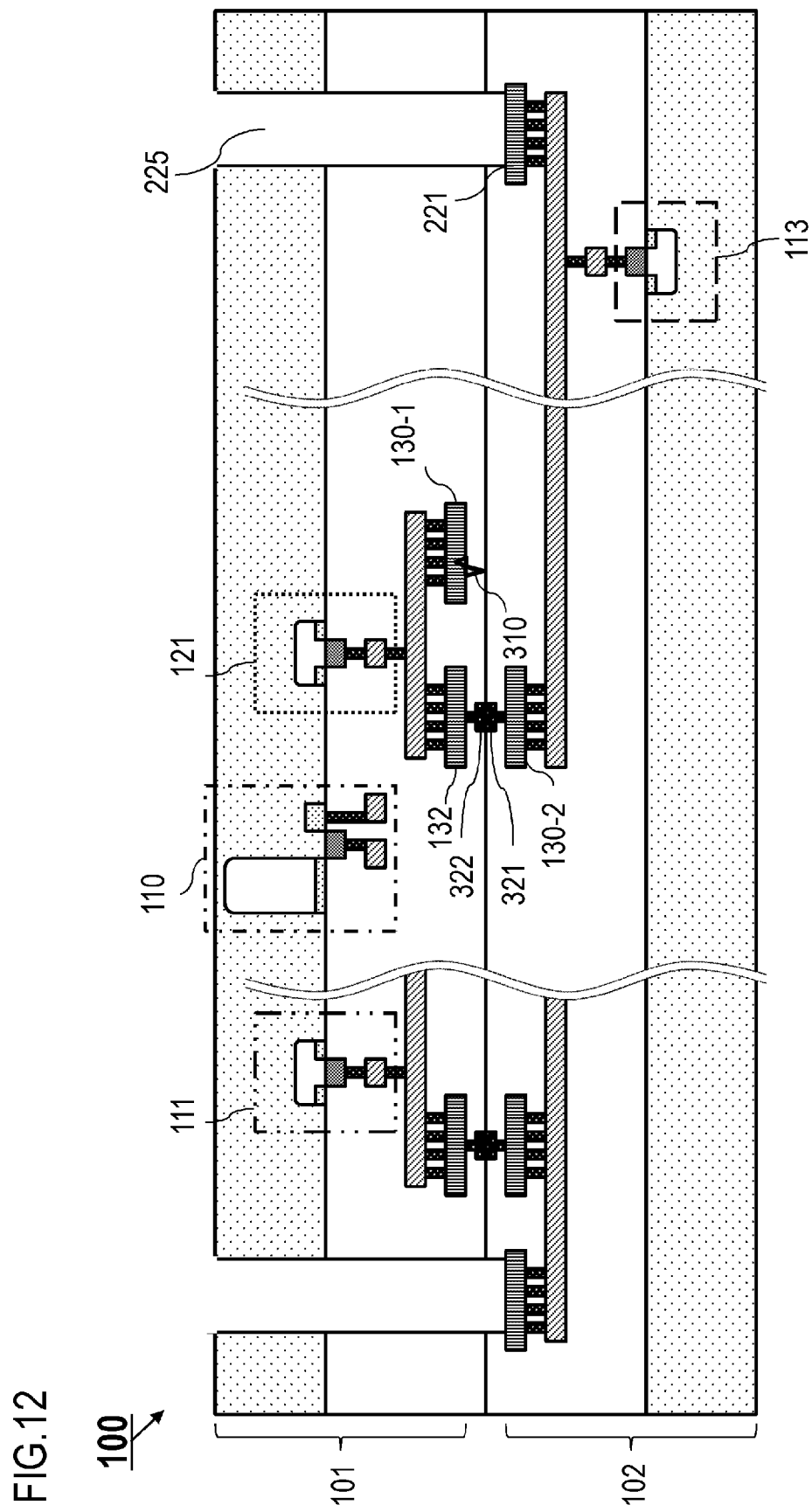
FIG. 12 is a schematic cross-sectional view illustrating a solid-state imaging device according to Embodiment 5.

In the method of manufacturing the solid-state imaging device according to Embodiment 4, the bonding portion 320 is formed on the input/output terminal 130-1 of the inspection circuit 121 of the semiconductor substrate 101 after the probe is brought into contact with the input/output terminal 130-1. The present embodiment will describe a method of manufacturing a solid-state imaging device 100 in which as illustrated in FIG. 12, a bonding portion 322 is formed on an input/output terminal 132 of an inspection circuit 121 without bringing a probe into contact with the input/output terminal 132. The present embodiment can suppress a reduction in yield without adding the step of removing a needle mark.

Referring to the flowchart in FIG. 5, the method of manufacturing the solid-state imaging device 100 according to Embodiment 5 will be described below. At the beginning of the flowchart, two semiconductor substrates not including wires of semiconductor layers (silicon) are prepared.

S1001; Substrate Forming Step

Figure 13A:
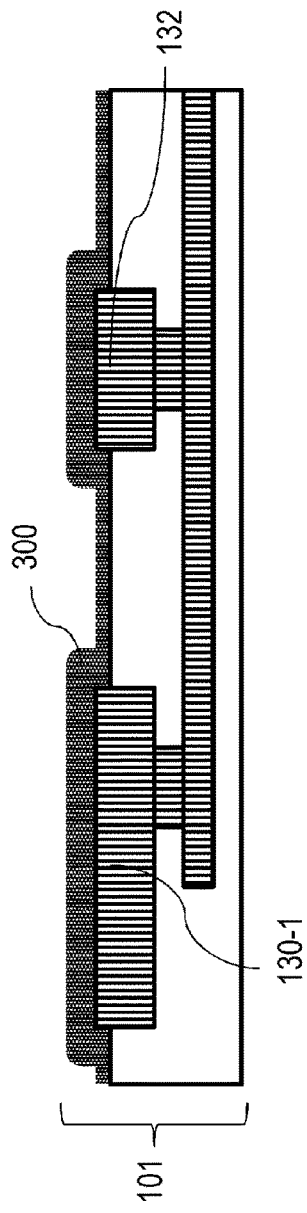
FIGS. 13A to 13C are cross-sectional views illustrating the process of manufacturing the solid-state imaging device according to Embodiment 5.

In S1001, a semiconductor substrate 101 and a semiconductor substrate 102 are formed as in Embodiment 4. At this point, the multiple inspection circuits 121 are formed in the semiconductor substrate 101. In the present embodiment, as illustrated in FIG. 13A, the semiconductor substrate 101 includes an input/output terminal 130-1 of the inspection circuit 121 and an input/output terminal 132 of the inspection circuit 121. In the semiconductor substrate 101, the input/output terminal 130-1 and the input/output terminal 132 are electrically connected to each other.

S1002; Inspection Step

Figure 13B:
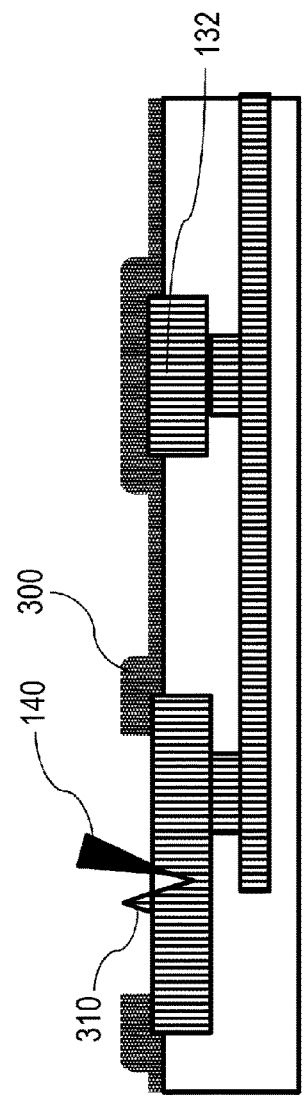

In S1002, as illustrated in FIG. 13B, a measurement probe 140 is brought into contact with the input/output terminal 130-1 and the semiconductor substrate 101 is measured (inspected) by using the inspection circuit 121 as in Embodiment 4. At this point, a needle mark 310 is formed on the input/output terminal 130-1 by the measurement probe 140 in contact with the terminal.

S1003; Bonding Step

Figure 13C:
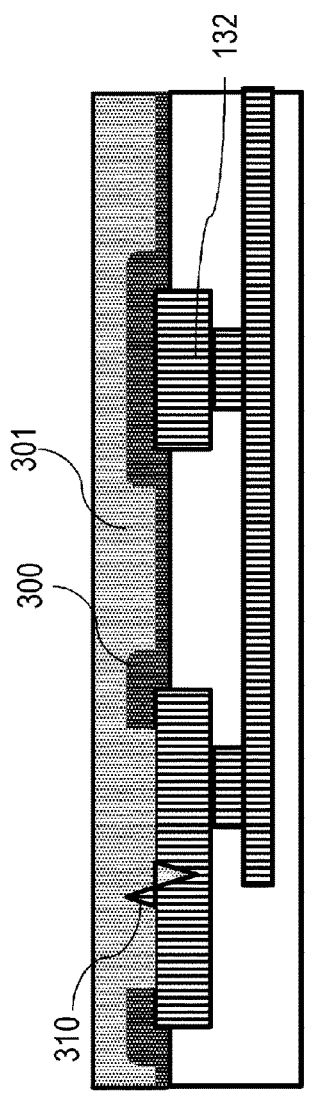

In S1003, as illustrated in FIG. 13C, an oxide film is first formed and flattened as in Embodiment 4.

Figure 14A:
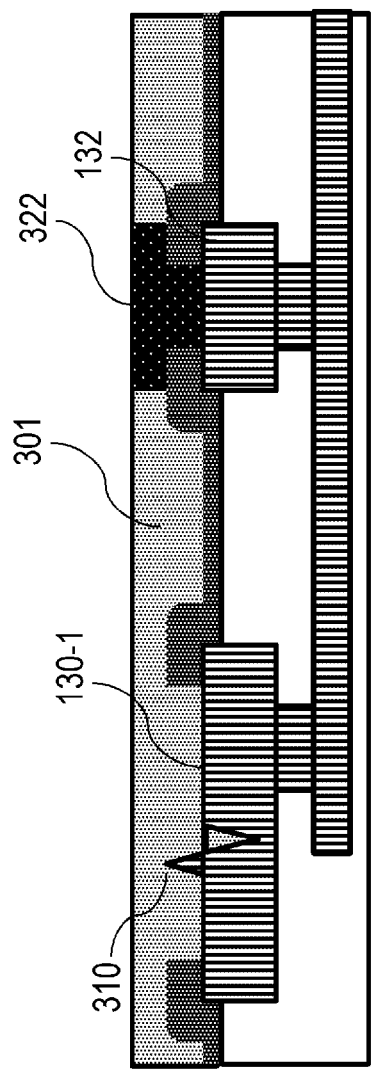
FIGS. 14A and 14B are cross-sectional views illustrating the process of manufacturing the solid-state imaging device according to Embodiment 5.

As illustrated in FIG. 14A, the bonding portion 322 is then formed on the input/output terminal 132 electrically connected to the input/output terminal 130-1. In this configuration, the measurement probe 140 is not brought into contact with the input/output terminal 132. The bonding portion 322 having conductivity is, for example, a micro bump predominantly composed of copper. The bonding portion 322 is formed by, for example, an ordinary dual damascene method. Multiple bonding portions 322 may be formed on the input/output terminal 132.

Figure 14B:
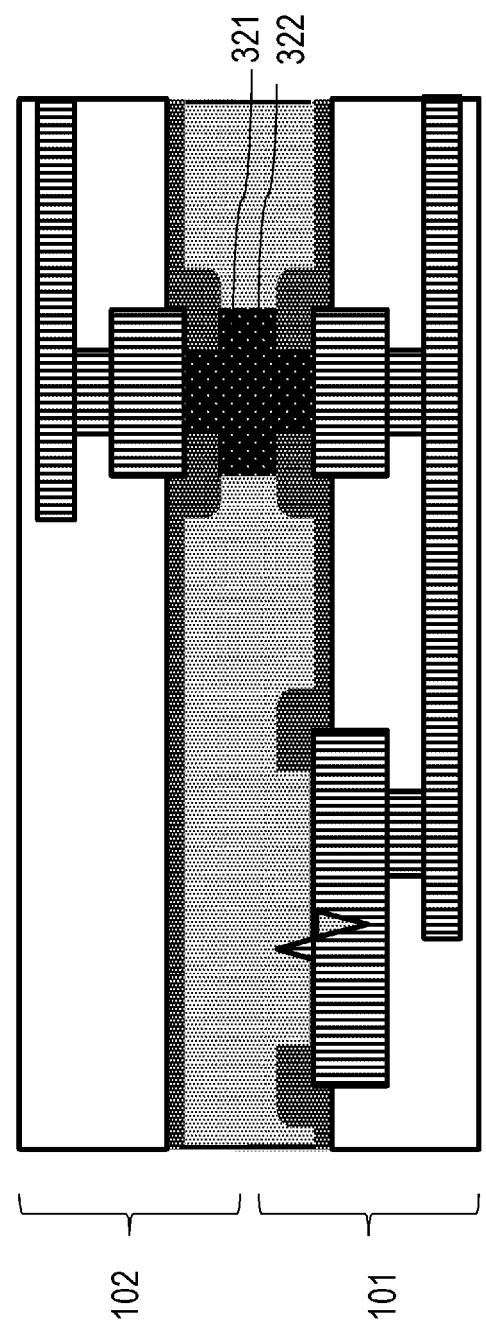

Thereafter, the semiconductor substrate 101 and the semiconductor substrate 102 are bonded to each other. For example, as illustrated in FIG. 14B, the bonding portion 322 is used to be bonded to a bonding portion 321 that is connected to a power supply (power supply wire, not illustrated) for supplying a potential in the other semiconductor substrate 102. Thus, after an inspection is conducted, the solid-state imaging device can be manufactured such that the input/output terminal 130-1 of the inspection circuit 121 is electrically connected to the potential of the other semiconductor substrate 102.

In Embodiments 1 to 5, the photoelectric conversion device includes the semiconductor substrates of two layers. The idea of the present invention is not limited to two layers and is also applicable to a photoelectric conversion device having three or more layers. In this case, inspection circuits may be formed on any substrate or multiple substrates.

Furthermore, the input and output of the inspection circuit and the potential of the gate of the enable switch may be electrically connected to a predetermined potential via a plurality of stacked connection parts. In Embodiment 3, the two inspection circuits are illustrated but three or more inspection circuits may be provided instead. In this case, enable switches may be provided as many as the inspection circuits.

Embodiment 6

Figure 7:
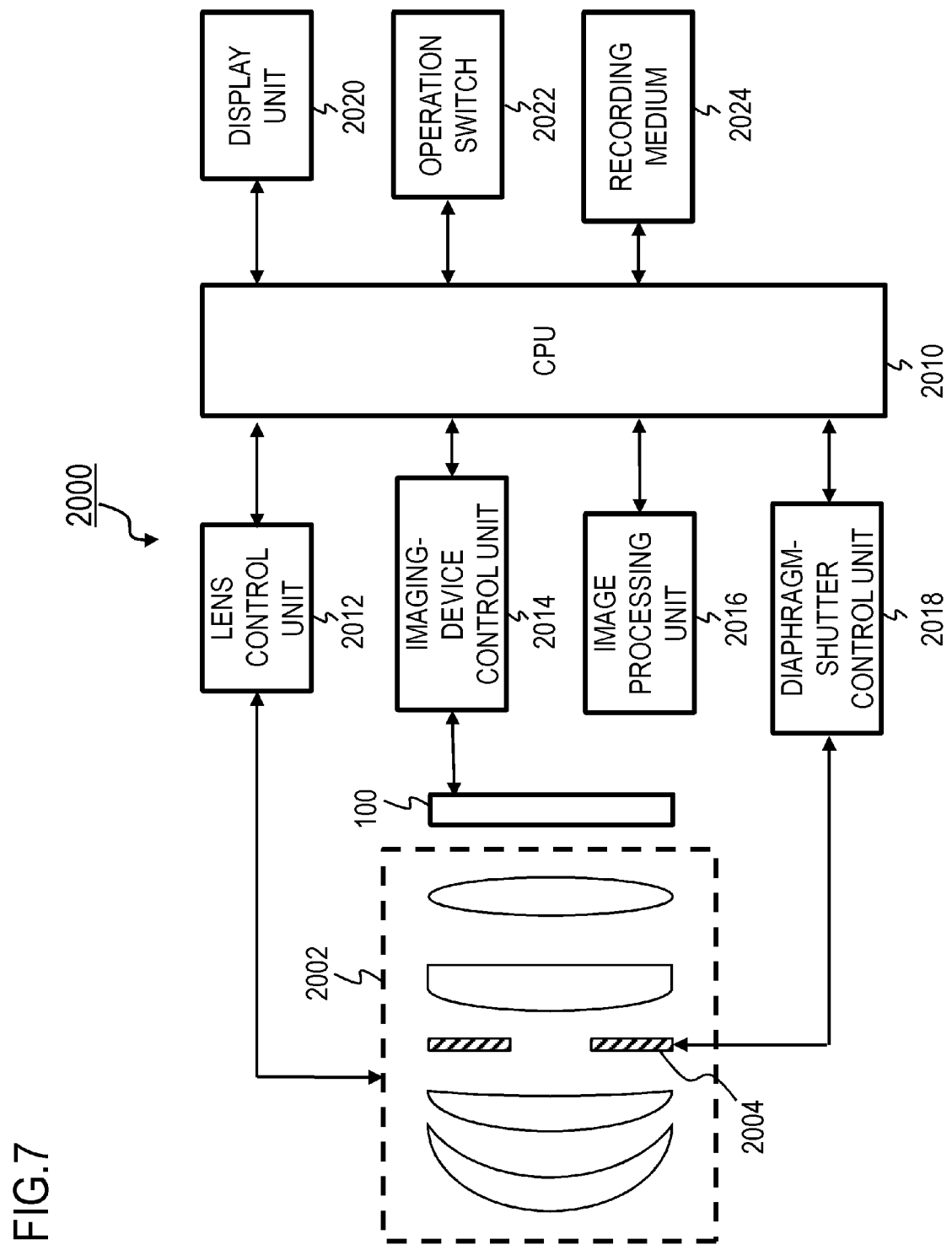
FIG. 7 illustrates a configuration embodiment of an imaging system according to Embodiment 6.

Referring to FIG. 7, an imaging system according to Embodiment 6 of the present invention will be described below. FIG. 7 is a block diagram illustrating a schematic configuration of the imaging system according to the present embodiment.

The solid-state imaging device 100 according to Embodiments 1 to 5 is applicable to various imaging systems. For example, the available imaging systems include, but not particularly limited to, various devices such as a digital still camera, a digital camcorder, a surveillance camera, a copier, a fax machine, a cellular phone, an onboard camera, an observation satellite, and a medical camera. The imaging system also includes a camera module provided with an optical system such as a lens and an imaging device (optical-electrical converter). FIG. 7 is a block diagram of a digital still camera illustrated as an example of the imaging system.

As illustrated in FIG. 7, an imaging system 2000 includes a solid-state imaging device 100, an imaging optical system 2002, a CPU 2010, a lens control unit 2012, an imaging-device control unit 2014, and an image processing unit 2016. Furthermore, the imaging system 2000 includes a diaphragm-shutter control unit 2018, a display unit 2020, an operation switch 2022, and a recording medium 2024.

The imaging optical system 2002 is an optical system for forming an optical image of a subject and includes lenses and a diaphragm 2004. The diaphragm 2004 has the function of adjusting a light amount during shooting by adjusting an aperture diameter and also acts as a shutter for adjusting an exposure time during still image shooting. The lenses and the diaphragm 2004 are held so as to move forward and backward along the optical axis and operate in a ganged manner, achieving a scaling function (zooming function) and a focusing function. The imaging optical system 2002 may be integrated with the imaging system or may be an imaging lens attachable to the imaging system.

The solid-state imaging device 100 is disposed with an imaging surface located in the image space of the imaging optical system 2002. The solid-state imaging device 100 is the solid-state imaging device described in Embodiments 1 to 5 and includes a CMOS sensor (pixel part) and a peripheral circuit (peripheral circuit region). The solid-state imaging device 100 includes pixels that are two-dimensionally disposed with optical/electrical conversion parts. Color filters are disposed on the pixels so as to constitute a two-dimensional single-color sensor. The solid-state imaging device 100 photoelectrically converts a subject image formed by the imaging optical system 2002 and then outputs the image as an image signal or a focus detection signal.

The lens control unit 2012 is configured to perform a scaling operation and a focus adjustment by controlling driving of a forward or backward movement of the lenses of the imaging optical system 2002. The lens control unit 2012 includes circuits and processors that are configured to perform the functions. The diaphragm-shutter control unit 2018 is configured to adjust the light amount of shooting by changing the aperture diameter of the diaphragm 2004 (changing an f number). The diaphragm-shutter control unit 2018 includes circuits and processors that are configured to perform the function.

The CPU 2010 is a controller that is disposed in a camera and controls the body of the camera in various ways. The CPU 2010 includes an arithmetic section, ROM, RAM, an A/D converter, a D/A converter, and a communication interface circuit. The CPU 2010 controls the operations of the units in the camera according to a computer program stored in ROM or the like and performs a series of shooting operations such as AF, imaging, image processing, and recording. The shooting operations include detection of a focused state of the imaging optical system 2002. The CPU 2010 also acts as a signal processing unit (signal processor).

The imaging-device control unit 2014 is configured to control the operation of the solid-state imaging device 100, performs A/D conversion on a signal outputted from the solid-state imaging device 100, and transmit the signal to the CPU 2010. The imaging-device control unit 2014 includes circuits and a controller that are configured to perform the functions. The solid-state imaging device 100 may have the function of A/D conversion. The image processing unit 2016 is a processor that generates an image signal by performing image processing such as y conversion and color interpolation to an A/D-converted signal. The image processing unit 2016 includes circuits and a controller that are configured to perform the function. The display unit 2020 is a display device such as a liquid crystal display (LCD). The display unit 2020 displays information on a camera shooting mode, a preview image before shooting, an image to be confirmed after shooting, and a focused state at the detection of a focus. The operation switch 2022 includes a power supply switch, a release (shooting trigger) switch, a zooming switch, and a shooting-mode selection switch. The recording medium 2024 is configured to record captured images or the like. The recording medium 2024 may be provided in the imaging system or may be detachably provided as a memory card or the like.

As described above, the imaging system 2000 including the solid-state imaging device 100 according to Embodiments 1 to 5 can be configured as a high-performance imaging system.

Embodiment 7

Figure 8A:
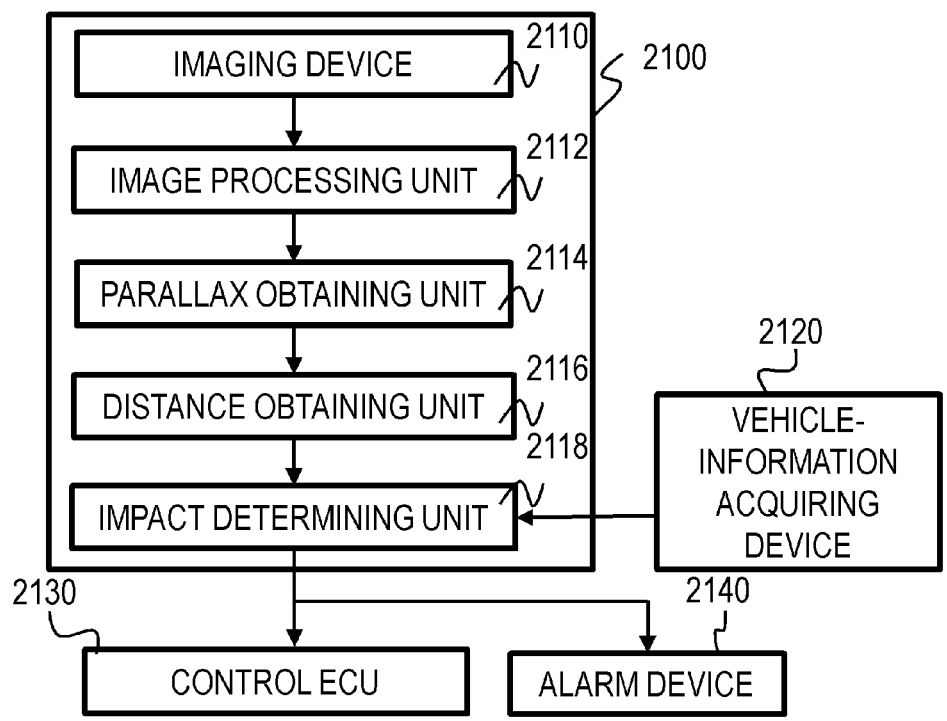
FIG. 8A illustrates a configuration embodiment of an imaging system according to Embodiment 7.
Figure 8B:
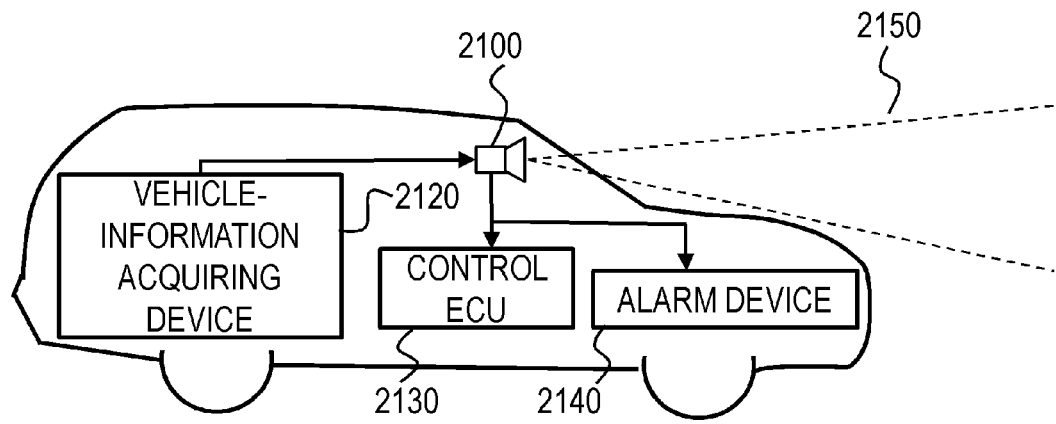
FIG. 8B illustrates a configuration embodiment of a movable body according to Embodiment 7.

Referring to FIGS. 8A and 8B, an imaging system and a movable body according to Embodiment 7 of the present invention will be described below. FIGS. 8A and 8B illustrate the configurations of the imaging system and the movable body according to the present embodiment.

FIG. 8A illustrates an example of an imaging system 2100 for an onboard camera. The imaging system 2100 includes an imaging device 2110. The imaging device 2110 is one of the solid-state imaging devices of Embodiments 1 to 5. The imaging system 2100 includes an image processing unit 2112 that is a processor for performing image processing on pieces of image data acquired from the imaging device 2110. The imaging system 2100 further includes a parallax obtaining unit 2114 that is a processor for calculating a parallax (a phase difference of a parallax image) from the pieces of image data acquired from the imaging device 2110. The imaging system 2100 further includes a distance obtaining unit 2116 that is a processor for calculating a distance to an object based on the calculated parallax and an impact determining unit 2118 that is a processor for determining the possibility of an impact based on the calculated distance. In this configuration, the parallax obtaining unit 2114 and the distance obtaining unit 2116 are examples of information acquiring means that acquires information such as information on a distance to an object. In other words, the distance information includes a parallax, a defocus amount, and a distance to an object. The impact determining unit 2118 may determine the possibility of an impact by using one kind of the distance information. The processors may be implemented by specifically designed hardware or general-purpose hardware for operations based on a software module. Alternatively, the processors may be implemented by a field programmable gate array (FPGA) or an application specific integrated circuit (ASIC) and the like. The processors may be implemented by a combination thereof.

The imaging system 2100 is connected to a vehicle-information acquiring device 2120 so as to acquire vehicle information including a vehicle speed, a yaw rate, and a rudder angle. The imaging system 2100 is also connected to a control ECU 2130 acting as a controller that outputs a control signal for generating a braking force for a vehicle based on a determination result from the impact determining unit 2118. In other words, the control ECU 2130 is an example of movable-body control unit that controls a movable body based on the distance information. The imaging system 2100 is also connected to an alarm device 2140 that issues an alarm to a driver based on a determination result from the impact determining unit 2118. For example, if the impact determining unit 2118 determines that the possibility of an impact is high, the control ECU 2130 performs vehicle control for avoiding a collision and reducing damage by applying a brake, releasing an accelerator, or suppressing an engine output. The alarm device 2140 issues a warning to a user by generating an audible alarm, displaying alarm information on the screen of a car navigation system or the like, or vibrating a seatbelt or a steering wheel.

In the present embodiment, the imaging system 2100 captures an image around a vehicle, for example, at the front or rear of the vehicle. FIG. 8B illustrates the imaging system 2100 that captures an image ahead of a vehicle (imaging range 2150). The vehicle-information acquiring device 2120 provides an instruction to activate the imaging system 2100 and capture an image. The imaging system 2100 of the present embodiment can improve the accuracy of distance measurement by using the solid-state imaging device 100 according to Embodiments 1 to 5 as the imaging device 2110.

The foregoing embodiments described control for avoiding a collision with other vehicles. The imaging system is also applicable to automated driving control for following other vehicles and automated driving control for keeping in a lane. The imaging system is also applicable to, for example, ships, airplanes, and movable bodies (transports) such as an industrial robot as well as vehicles such as automobiles. Moving apparatuses in a movable body (transport) are various driving sources for an engine, a motor, wheels, and a propeller. Additionally, the imaging system is applicable to apparatuses using wide object recognition, for example, an intelligent transportation system (ITS) as well as a movable body.

OTHER EMBODIMENTS

The configurations and processing in the foregoing embodiments and modifications may be optionally combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-234636, filed on Dec. 14, 2018 and Japanese Patent Application No. 2019-161284, filed on Sep. 4, 2019, which are hereby incorporated by reference herein in their entirety.

What is claimed is:

1. A photoelectric conversion device comprising:
a first substrate that includes a pixel circuit including a photoelectric conversion element;
a second substrate having a signal processing circuit that drives the pixel circuit or processes a signal from the pixel circuit;
a connection part electrically connecting the first substrate and the second substrate; and
an inspection circuit,
wherein the inspection circuit is formed in a semiconductor region in one of the first and second substrates and is connected to a wire supplying a first potential and being provided in the one of the first and second substrates, and
the inspection circuit is connected via the connection part to a wire supplying a second potential and being provided in the other of the first and second substrates.

2. The photoelectric conversion device according to claim 1, wherein the first potential is supplied to a power-supply connecting terminal in the inspection circuit,
the second potential is supplied to at least one of an input terminal and an output terminal other than the power-supply connecting terminal in the inspection circuit, and
the connection part is connected to at least one of the input terminal and the output terminal.

3. The photoelectric conversion device according to claim 1, wherein the inspection circuit inspects the pixel circuit or the signal processing circuit.

4. The photoelectric conversion device according to claim 1, wherein the first potential is supplied to the inspection circuit connected to a power supply wire shared with a circuit other than the inspection circuit in the one of the first and second substrates including the inspection circuit.

5. The photoelectric conversion device according to claim 1, wherein the second potential is supplied to the inspection circuit connected to a power supply wire shared with a circuit in the other of the first and second substrates via the connection part.

6. The photoelectric conversion device according to claim 1, wherein the first substrate includes a peripheral circuit in addition to the pixel circuit,
the inspection circuit is formed in the second substrate,
the first potential is supplied to the inspection circuit connected to a power supply wire shared with the signal processing circuit, and
the second potential is supplied to the inspection circuit connected via the connection part to a power supply wire shared with the peripheral circuit.

7. The photoelectric conversion device according to claim 1, wherein the first substrate includes a peripheral circuit in addition to the pixel circuit,
the inspection circuit is formed in the first substrate,
the first potential is supplied to the inspection circuit connected to a power supply wire shared with the peripheral circuit, and
the second potential is supplied to the inspection circuit connected via the connection part to a power supply wire shared with the signal processing circuit.

8. The photoelectric conversion device according to claim 1, comprising:
a plurality of inspection circuits formed on the same substrate, the plurality of inspection circuits including at least the inspection circuit; and
a plurality of switches, each connecting corresponding one of the inspection circuits and the connection part.

9. The photoelectric conversion device according to claim 8, wherein the switches have gates that are connected to each other.

10. The photoelectric conversion device according to claim 1, further comprising a second connection part that electrically connects the pixel circuit of the first substrate and the signal processing circuit of the second substrate.

11. An imaging system comprising:
the photoelectric conversion device according to claim 1; and
a signal processor that processes a signal outputted from the photoelectric conversion device.

12. A movable body comprising:
the photoelectric conversion device according to claim 1;
a moving apparatus;
a processor that acquires information from a signal outputted from the photoelectric conversion device; and
a controller that controls the moving apparatus based on the information.

13. The photoelectric conversion device according to claim 1 further comprising a first pad which is electrically connected to the inspection circuit, and a second pad which is electrically connected to another circuit,
wherein the first pad and the second pad are formed at the same altitude in stacking direction of the photoelectric conversion device.

14. The photoelectric conversion device according to claim 1 further comprising a pad which is electrically connected to the inspection circuit,
wherein the pad and the connection part are formed at the same altitude in stacking direction of the photoelectric conversion device.

15. A method of manufacturing a photoelectric conversion device, comprising:
a step of preparing a first substrate having a pixel circuit including a photoelectric conversion element;
a step of preparing a second substrate having a signal processing circuit that drives the pixel circuit or processes a signal from the pixel circuit; and
a step of bonding the first substrate and the second substrate for forming a connection part electrically connecting the first substrate and the second substrate,
wherein one of the first and second substrates includes an inspection circuit having a power-supply connecting terminal connected to a wire supplying a first potential and being provided in the one of the first and second substrates, and
the step of bonding comprises:
a step of forming the connection part by using one of an input terminal and an output terminal of the inspection circuit which are different node from the power-supply connecting terminal of the inspection circuit; and
a step of connecting the one of the input terminal and the output terminal of the inspection circuit to a wire supplying a second potential and being provided in the other of the first and second substrates.

16. The method of manufacturing a photoelectric conversion device according to claim 15, further comprising a step of inspecting the one of the first and second substrates including the inspection circuit before the bonding step,
wherein the step of the inspecting includes a step of bringing a probe into contact with one of the input terminal and the output terminal of the inspection circuit.

17. A method of manufacturing a semiconductor device including a second substrate to be bonded to a first substrate, comprising:
- a step of forming the second substrate including (1) a second circuit for driving a first circuit disposed in the first substrate or processing a signal from the first circuit and (2) an inspection circuit formed in a semiconductor region for inspecting the second circuit; and
- a step of inspecting the second circuit with a probe brought into contact with at least one of the input terminal and the output terminal of the inspection circuit,
- wherein, in the step of forming, the at least one of the input terminal and the output terminal of the inspection circuit is configured to be connected to a wire supplying a predetermined potential and being provided in the first substrate.

18. The method of manufacturing a semiconductor device according to claim 17, further comprising, after the step of the inspecting, a step of performing bonding for connecting at least one of the input terminal and the output terminal of the inspection circuit to a wire for supplying a predetermined potential in the first substrate.

19. A method of manufacturing a photoelectric conversion device, comprising:
- a step of preparing a first substrate having a pixel circuit including a photoelectric conversion element;
- a step of preparing a second substrate having a signal processing circuit that drives the pixel circuit or processes a signal from the pixel circuit;
- a step of inspecting with a probe brought into contact with a terminal of an inspection circuit formed in one of the first and second substrates; and
- a step of bonding the first substrate and the second substrate to each other via a bonding portion so as to electrically connect the terminal of the inspection circuit to a wire supplying a predetermined potential and being provided in the other of the first and second substrates,
- the step of bonding comprising:
  - a step of forming, after the probe is brought into contact with the terminal in the step of the inspecting, an oxide film on the one of the first and second substrates,
  - a step of flattening the oxide film; and
  - a step of forming the bonding portion on the terminal of the inspection circuit having been in contact with the probe in the step of the inspecting.

20. A method of manufacturing a photoelectric conversion device, comprising:
- a step of preparing a first substrate having a pixel circuit including a photoelectric conversion element;
- a step of preparing a second substrate having a signal processing circuit that drives the pixel circuit or processes a signal from the pixel circuit;
- a step of inspecting with a probe brought into contact with a first terminal among a plurality of terminals of an inspection circuit formed in one of the first and second substrates, the plurality of terminals of an inspection circuit being connected to each other; and
- a step of bonding the first substrate and the second substrate to each other via a bonding portion so as to electrically connect the terminal of the inspection circuit formed to a wire for supplying a predetermined potential in the other of the first and second substrates,
- the step of bonding comprising:
  - a step of forming, after the probe is brought into contact with the first terminal in the step of inspecting, an oxide film on the one of the first and second substrates,
  - a step of flattening the oxide film; and
  - a step of forming the bonding portion on a second terminal among the plurality of terminals of the inspection circuit formed in the one of the first and second substrates, the second terminal being different from the first terminal.

21. The method of manufacturing a photoelectric conversion device according to claim 20,
wherein the second terminal is not in contact with the probe at least during the step of inspecting.

22. A photoelectric conversion device comprising:
- a first substrate that includes a pixel circuit including a photoelectric conversion element;
- a second substrate having a signal processing circuit that drives the pixel circuit or processes a signal from the pixel circuit;
- a connection part electrically connecting the first substrate and the second substrate; and
- an inspection circuit,
- wherein a power-supply connecting terminal of the inspection circuit is formed in one of the first and second substrates and is connected to a wire supplying a first potential and being provided in the one of the first and second substrates, and
- another terminal of the inspection circuit is connected via the connection part to a wire supplying a second potential and being provided in the other of the first and second substrates.

* * * * *